US 6,656,852 B2

(12) United States Patent
Rotondaro et al.

(10) Patent No.: US 6,656,852 B2
(45) Date of Patent: Dec. 2, 2003

(54) METHOD FOR THE SELECTIVE REMOVAL OF HIGH-K DIELECTRICS

(75) Inventors: Antonio Luis Pacheco Rotondaro, Dallas, TX (US); James Joseph Chambers, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/006,081

(22) Filed: Dec. 6, 2001

(65) Prior Publication Data

US 2003/0109106 A1 Jun. 12, 2003

(51) Int. Cl.$^7$ .................... H01L 21/302; H01L 21/461; H01L 21/336
(52) U.S. Cl. ................ 438/749; 438/745; 438/287; 134/1.3
(58) Field of Search ................... 438/287, 745, 438/749, 753; 134/1.3, 26

(56) References Cited

U.S. PATENT DOCUMENTS

| | | | |
|---|---|---|---|
| 4,100,014 A | | 7/1978 | Kuhn-Kuhnenfeld et al. |
| 4,280,108 A | | 7/1981 | Scifres et al. |
| 5,294,570 A | | 3/1994 | Fleming, Jr. et al. |
| 5,567,244 A | | 10/1996 | Lee et al. |
| 5,817,182 A | | 10/1998 | O'Brien |
| 6,132,522 A | * | 10/2000 | Verhaverbekke et al. ..... 134/26 |
| 6,149,828 A | * | 11/2000 | Vaartstra ................. 216/57 |
| 6,273,959 B1 | | 8/2001 | Oonishi et al. |

* cited by examiner

*Primary Examiner*—Alexander Ghyka
(74) *Attorney, Agent, or Firm*—Carlton H. Hoel; W. James Brady; Frederick J. Telecky, Jr.

(57) ABSTRACT

One aspect of the invention relates to a method of etching a high-k dielectric. The method involves removing an exposed portion of a high-k dielectric layer from a substrate by wet etching with a solution comprising water, a strong acid, an oxidizing agent, and a fluorine compound. The etching solution provides selectivity towards the high-k film against insulating materials and polysilicon and is therefore useful in manufacturing FETs.

23 Claims, 2 Drawing Sheets

100

101
ETCH TO REMOVE A BULK PORTION OF THE EXPOSED HIGH-K DIELECTRIC MATERIAL

103
ETCH TO REMOVE THE REMAINING PORTION OF THE EXPOSED HIGH-K DIELECTRIC MATERIAL USING AN AQUEOUS SOLUTION CONTAINING A STRONG ACID, AN OXIDIZING AGENT, AND A FLUORINE COMPOUND

METHOD FOR THE SELECTIVE REMOVAL OF HIGH-K DIELECTRICS

FIELD OF INVENTION

The present invention relates generally to semiconductor device manufacturing and more particularly to methods of manufacturing devices with high-k dielectric materials.

BACKGROUND OF THE INVENTION

In the semiconductor industry, there is a continuing trend toward high device densities. To achieve these high device densities, small features on semiconductor wafers are required. These features include the width and spacing of source and drain regions, channel regions, and conductive lines.

The features form devices, such as field effect transistors (FETs). An FET includes a source and drain region separated by a channel. A control gate, typically of polysilicon, is formed over the channel and is electrically separated from the channel by a gate dielectric layer, which is typically silicon dioxide. A current will either flow or not flow across the channel between the source and the drain depending on the voltage applied to the control gate.

A limitation on the degree to which FETs can be scaled down is the difficulty of forming very thin gate oxides. As FETs become progressively smaller, the electrical capacitance of the gate dielectric must be proportionally increased. Using conventional gate oxide material, which is silicon dioxide, a layer of about 1 nm or less is required for devices with 0.10 $\mu$m features. At such small thicknesses, non-uniformity of the gate oxide layer, tunneling of electrons through the gate oxide layer, and diffusion of dopants through the gate oxide layer become problematic.

In view of these issues, it has been proposed to replace silicon dioxide gate dielectrics with so called high-k dielectrics. High-k dielectrics have higher permittivity than silicon dioxide, whereby a gate layer providing a given degree of capacitance can be made thicker than an equivalent layer of silicon dioxide. High-k dielectrics typically have a permitivity of at least about 3 times that of silicon dioxide, whereby the gate dielectric is at least about three times thicker.

An obstacle to the use of high-k dielectrics has arisen at the point of pattern transfer to a layer of the high-k dielectric. Conventional etching processes that might be effective to remove the high-k dielectric, processes such as reactive ion etching and wet etching with hydrofluoric acid have proven ineffective at removing the high-k while avoiding damaging either the underlying insulating structures, such as field oxide islands that become exposed as the high-k layer is patterned, or overlying conductive layers, such as a layer of polysilicon which forms a transistor gate. There is an unsatisfied need for methods of etching high-k dielectrics without unduly damaging exposed polysilicon or underlying field oxides.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of the summary is to present some concepts of the invention in a simplified form as a prelude to the more detailed description that is presented later. The invention provides systems and methodologies for calibrating transistor circuits and devices, by which the above and other shortcomings associated with the prior art are mitigated or overcome.

One aspect of the invention relates to a method of etching a high-k dielectric. The method involves removing an exposed portion of a high-k dielectric layer from a substrate by wet etching with a solution comprising water, a strong acid, an oxidizing agent, and a fluorine compound. The etching solution provides selectivity towards the high-k film against insulating materials and polysilicon and is therefore useful in manufacturing FETs.

In accordance with one aspect of the present invention, a multi-step etch process is employed, wherein one type of etchant is used to remove a bulk portion of an exposed region of the high-k dielectric film in a time efficient manner. For example, a substantial portion of the high-k film, about 70–90% thereof is removed using a diluted HF mixture such as about 0.5% HF in a solution such as de-ionized water.

Upon completing the bulk removal, a different etch chemistry is employed which exhibits an advantageously high selectivity towards other materials present during the etch, for example, polysilicon and silicon dioxide. The second etch comprises an aqueous solution that comprises a strong acid, an oxidizing agent and a fluorine compound. The ratio of these chemicals provides a substantially expedient removal of the remaining portion of the high-k dielectric film without an appreciable loss of silicon dioxide or polysilicon. Due to the advantageously high selectivity of the second etch, an overetch of the high-k dielectric film may be employed to ensure complete removal thereof, thereby avoiding knock-on implantation of metal during subsequent implantation steps, inhibition of silicide formation, an increase in the gate-to-drain capacitance (Cgd), and the appearance of fringing fields at the corner of the gate.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
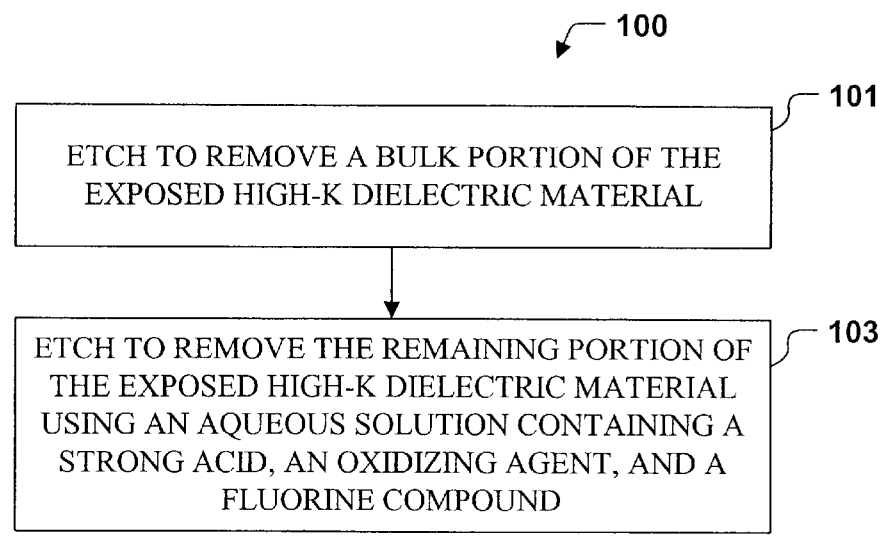
FIG. 1 is a flow chart of a process according to one aspect of the present invention.

The present invention will now be described with reference to the attached drawings, wherein like reference numerals are used to refer to like elements throughout. FIG. 1 is a flow chart of a process 100 for removing an exposed portion of a high-k dielectric layer from a substrate. Although the exemplary method 100 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems not illustrated.

Returning to FIG. 1, an exposed portion of a high-k dielectric layer can be the entire dielectric layer. More commonly, however, a part of the dielectric layer is covered by a patterned layer such as a patterned resist layer, a patterned polysilicon, or both. Process 100 removes that portion of the high-k dielectric layer that is not masked by an overlying patterned layer. Thus, process 100 is typically used to transfer a pattern to a high-k dielectric layer.

Process 100 includes action 101, etching to remove a bulk portion of the exposed high-k dielectric, and action 103, etching to remove the remaining portion of the exposed high-k dielectric. Action 103 involves etching with an aqueous solution that contains a strong acid, an oxidizing agent, and a fluorine compound. Action 101 can involve etching with the same solution, in which case actions 101 and 103 become one step, however, action 101 is generally carried out with a different etching process, whereby the overall process is accelerated.

The substrate generally comprises a semiconductor, typically silicon. Other examples of semiconductor substrates include GaAs and InP. In addition to a semiconductor, the substrate may include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc. Typically, the substrate includes islands of oxide insulator such as silicon dioxide or tetraethyl orthosilicate (TEOS). These islands of oxide insulator are typically formed by either LOCOS (local oxidation of silicon) or STI (shallow trench isolation) processes. The substrate also typically includes a polysilicon (poly) layer formed over the high-k dielectric and lithographically patterned.

The process 100 can be applied to etch any suitable high-k dielectric material. In one embodiment, the high-k dielectric has a permittivity at least about 3 times that of silicon dioxide. In another embodiment, the high-k dielectric has a permittivity at least about 10 times that of silicon dioxide. In a further embodiment, the high-k dielectric has a permittivity at least about 20 times that of silicon dioxide.

Examples of high-k dielectrics include silicates, aluminates, titanates, and metal oxides. Examples of silicate high-k dielectrics include silicates of Ta, Al, Ti, Zr, Y, La and Hf, including Zr and Hf doped silicon oxides and silicon oxynitrides. Examples of aluminates include refractory metal aluminates, such as compounds of Zr and Hf, and aluminates of Lanthanide series metals, such as La, Lu, Eu, Pr, Nd, Gd, and Dy. Examples of titanate high-k dielectrics include $BaTiO_3$, $SrTiO_3$, and $PdZrTiO_3$. Examples of metal oxide high-k dielectrics include oxides of refractory metals, such as Zr and Hf, and oxides of Lanthanide series metals, such as La, Lu, Eu, Pr, Nd, Gd, and Dy. Additional examples of metal oxide high-k dielectrics include $Al_2O_3$, $TiO_2$, $Ta_2O_5$, $Nb_2O_5$ and $Y_2O_3$.

The high-k dielectric is generally formed in a layer over a substrate with islands of oxide insulator. The high-k dielectric layer is formed by any suitable process, such as spin coating, chemical vapor deposition or physical vapor deposition. Generally, prior to etching, the high-k dielectric forms a continuous layer over the substrate. In one embodiment, the layer is from about 1 nm to about 100 nm thick. In another embodiment, the layer is from about 3 nm to about 50 nm thick. In a further embodiment, the layer is from about 2 nm to about 30 nm thick.

Generally, only a portion of the high-k dielectric is exposed and is to be removed by the process 100. Generally, the dielectric is exposed in a lithographically defined pattern, for example, in a patterned resist or a patterned polysilicon layer. The pattern gaps can be of any suitable size or shape. In one embodiment, the pattern includes gaps having widths within the range from about from 0.1 to about 100 $\mu$m. In another embodiment, the pattern includes gaps having widths within the range from about from 0.18 to about 10 $\mu$m. In a further embodiment, the pattern includes gaps having widths within the range from about from 0.02 to about 1 $\mu$m.

Action 101 removes the bulk of the exposed portion of the high-k dielectric. In one embodiment, action 101 removes up to about 90% of the exposed portion of the high-k dielectric. In another embodiment, action 101 removes up to about 80% of the exposed portion of the high-k dielectric. In a further embodiment, action 101 removes up to about 70% of the exposed portion of the high-k dielectric.

Action 101 can be carried out by any suitable process, such as plasma etching, reactive ion etching, or wet etching. Wet etching can be carried out with an acid such as a dilute solution of HF, a solution of $H_2SO_4$ and $H_2O_2$, or a solution of nitric acid. Action 101 can be carried out using the same conditions as action 103, however, action 101 does not require selectivity against etching materials that underlie the high-k dielectric and therefore generally presents less stringent design requirements than action 103.

Action 103 involves wet etching to remove the remaining exposed portion of the high-k dielectric with an aqueous solution comprising a strong acid, an oxidizing agent, and a fluorine compound. Examples of strong acids include $H_2SO_4$, trifluoroacetic acid, HCl, and nitric acid. Examples of oxidizing agents include $H_2O_2$, $O_3$, and nitric acid. Examples of fluorine compounds include HF, fluorosulfuric acid, ammonium fluoride, and ammonium bi-fluoride. Generally, the strong acid, the oxidizing agent, and the fluorine compound are each a different chemical compound. The aqueous solution can include other ingredients such as phosphoric acid to control viscosity and/or a chelating agent.

The aqueous solution typically includes from about 25 to about 95 percent by volume of the strong acid, from about 0 to about 20 percent by volume of the oxidizing agent, and from about 0.001 to about 0.5 percent by volume of the fluorine compound. The proportions can be selected to achieve a compromise between etch rate and selectivity. In one embodiment, the solution is about 60 to about 80 percent by volume strong acid, about 1 to about 10 percent by volume oxidizing agent, and about 0.005 to about 0.1 percent by volume fluorine compound.

In another embodiment, the aqueous solution has a selectivity (etch rate divided by high-k dielectric etch rate) from about 30:1 to about 1:10 between an overlying polysilicon and the high-k dielectric. In a further embodiment, the aqueous solution has a selectivity from about 5:1 to about 1:7 between silicon dioxide and the high-k dielectric. Increasing the concentration of the fluorine compound increases the etch rate. Decreasing the concentration of the fluorine compound generally improves selectivity in favor of the high-k dielectric.

Preferably, action 103 provides substantially complete removal of the exposed portion of the high-k dielectric. In one embodiment, action 103 reduces the high-k dielectric concentration to less than about $1\times10^{13}$ atoms per $cm^2$ over that portion of the substrate surface where the high-k dielectric is not masked. In another embodiment, action 103 reduces the high-k dielectric concentration to less than about $1\times10^{12}$ atoms per $cm^2$. In a further embodiment, action 103 reduces the high-k dielectric concentration to less than about $1\times10^{11}$ atoms per $cm^2$. Action 103 generally leaves the substrate surface in a hydrophobic state.

Action 103 is generally carried out at a temperature from about 70 to about 115° C. Temperatures in this range often result from the heat of mixing and the heat of reaction associated with the formation and application of the multi-component etching solution. Action 103 is typically completed in from about 10 minutes to about 20 minutes. Preferably the entirety of process 100, including both actions 101 and 103, is completed in less than about an hour. A de-ionized rinse is commonly employed after wet etching. Following action 103 and or action 101, the surface can be rinsed with de-ionized water, optionally hot.

Process 100 can be used in a process for manufacturing FETs. For example, a process for forming FETs may comprise the steps of forming field oxide isolation regions on a silicon substrate. In addition, the process may further comprise forming a layer of high-k dielectric over the substrate, forming a poly layer over the high-k dielectric layer, forming a patterned resist layer over the poly layer, etching to transfer the resist pattern to the poly layer, and etching to transfer the resist pattern to the high-k dielectric layer according to process 100. The high-k dielectric layer is etched to remove the high-k layer, for example, from source areas, drain areas, and field oxide areas. The high-k dielectric is removed from these areas to, for example, avoid knock-on implantation of metals during subsequent source and drain implantation steps.

Figure 2:
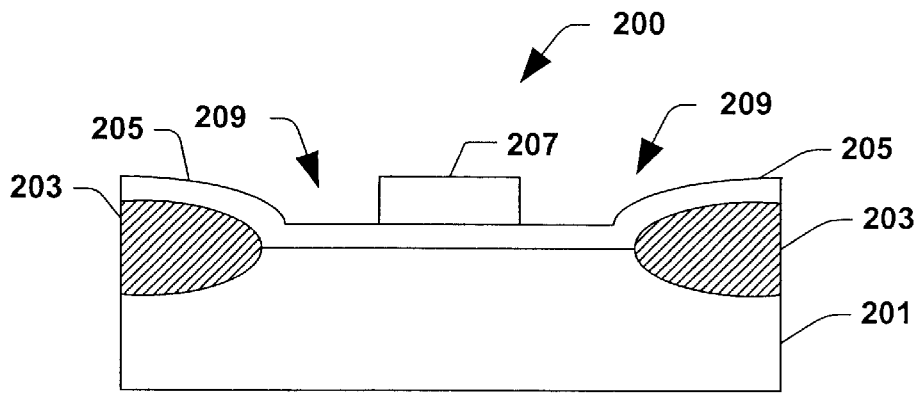
FIG. 2 is a schematic illustration of a substrate to which a process of the invention can be applied.
Figure 3:
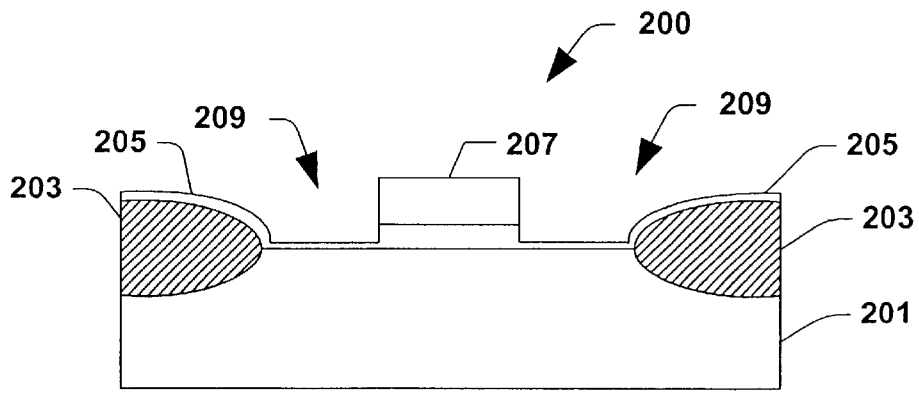
FIG. 3 is a schematic illustration of the substrate of FIG. 2 after etching a bulk portion of the exposed high-k dielectric.
Figure 4:
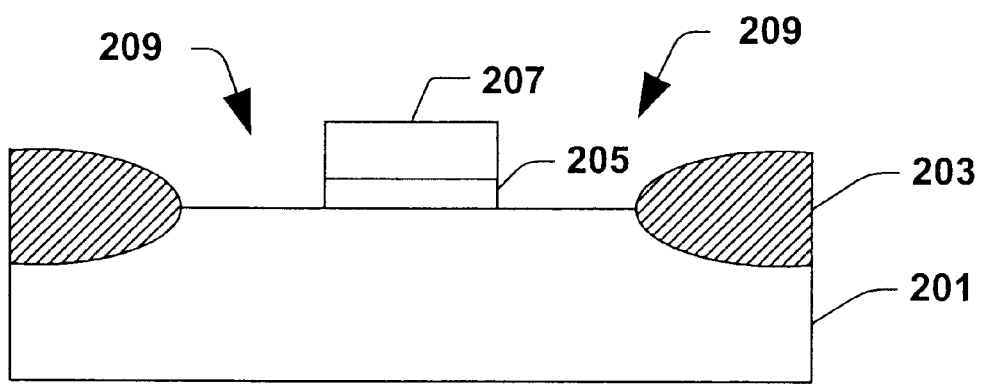
FIG. 4 is a schematic illustration of the substrate of FIG. 3 after etching away the remaining portion of the exposed high-k dielectric.

FIGS. 2 to 4 illustrate a particular example of process 100. FIG. 2 illustrates a substrate 200 to which the process is applied. Substrate 200 has a structure that commonly occurs during the manufacture of semiconductor devices with FETs employing high-k dielectrics. The substrate 200 includes silicon wafer 201, field oxide islands 203, high-k dielectric layer 205 (Zr or Hf silicate, for example), and polysilicon layer 207. The polysilicon layer 207 has been patterned to provide gaps 209 wherein a portion of the high-k dielectric layer 205 is exposed. The polysilicon layer might be itself coated with a patterned resist. It should be noted, however, that even where the polysilicon layer is covered by a resist, the polysilicon is vulnerable to transverse etching that undercuts the resist layer.

FIG. 3 illustrates the substrate 200 after about 75% of the exposed portion of the high-k dielectric has been removed, for example, by etching with a dilute HF solution. At this point in the process, none of the underlying field oxide 203 is exposed. The portion of the high-k dielectric masked by the polysilicon layer 207 is substantially unaffected.

FIG. 4 illustrates the substrate 200 after the remaining portion of the exposed high-k dielectric has been removed using a final etching solution. The final etching solution includes, for example, $H_2SO_4$, $H_2O_2$, HF, and $H_2O$ in the proportions 25:1:0.015:6 by volume. The substrate is exposed to the final etching solution for about 20 minutes at a temperature of about 100° C. The concentration of the high-k dielectric is thereby reduced to less than about $1\times10^{11}$ atoms per $cm^2$ over the exposed portions of substrate 200, while the field oxide 203 is not significantly affected.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of removing an exposed portion of a high-k dielectric layer from a substrate, comprising:
   providing a substrate with a high-k dielectric layer;
   wet etching with a final etching solution consisting essentially of water, a strong acid, an oxidizing agent, and a fluorine compound;
   wherein the strong acid is not the same as the fluorine compound.

2. The method of claim 1, wherein the high-k dielectric layer is at least about 1 nm thick.

3. The method of claim 1, wherein the strong acid is sulfuric acid.

4. The method of claim 1, wherein the oxidizing agent is hydrogen peroxide.

5. The method of claim 1, wherein the fluorine compound is hydrofluoric acid.

6. The method of claim 1, wherein the strong acid is sulfuric acid, oxidizing agent is hydrogen peroxide, and the fluorine compound is hydrofluoric acid.

7. The method of claim 1, further comprising etching with a first etching solution to remove a bulk portion of the exposed portion of the high-k dielectric prior to wet etching with the final etching solution, wherein the first etching solution is different from the final etching solution.

8. The method of claim 7, wherein the first wet etching solution consists essentially of dilute hydrofluoric acid.

9. The method of claim 1, wherein the substrate comprises islands of oxide insulator.

10. The method of claim 9, wherein the islands of oxide insulator comprise a material selected from the group consisting of silicon oxide, TEOS and a combination thereof.

11. The method of claim 1, wherein the high-k dielectric comprises a silicate.

12. The method of claim 1, wherein the high-k dielectric comprises a metal oxide.

13. The method of claim 1, wherein the high-k dielectric comprises an aluminate.

14. The method of claim 1, wherein the high-k dielectric comprises an metal oxynitride or a metal-silicon oxynitride.

15. The method of claim 1, wherein the substrate comprises a polysilicon layer patterned over a layer of the high-k dielectric.

16. The method of claim 1, wherein the substrate comprises a silicon wafer.

17. A method of manufacturing a field effect transistor, comprising:
    forming isolation regions;
    forming a gate layer comprising a high-k dielectric;
    forming a poly layer;
    patterning the poly layer; and
    patterning the gate layer; wherein
       the gate layer is patterned using a process according to claim 1.

18. A method of etching high-k dielectric, comprising:
    providing high-k dielectric material;
    etching with a first solution comprising a first strong acid to remove a bulk portion of the high-k dielectric;
    etching with a second solution comprising water, a second strong acid, an oxidizing agent, and a fluorine compound to remove a second portion of the high-k dielectric;
    wherein the first solution is not the same as the second solution, the second strong acid is not the same as the fluorine compound, and the second portion of the high-k dielectric is at least 1/10th the thickness of the bulk potion of the high-k dielectric.

19. The method of claim 18, wherein the second strong acid is sulfuric acid and the oxidizing agent is hydrogen peroxide.

20. The method of claim 19, wherein the fluorine compound is hydrofluoric acid.

21. The method of claim 20, wherein the first strong acid is hydrofluoric acid.

22. The method of claim 18, wherein etching with the second solution is performed at a temperature of about 60° C. or more and about 140° C. or less.

23. A method of etching through a high-k dielectric layer of at least 1 nm thickness, comprising:
    providing a high-k dielectric layer of at least 1 nm thickness;
    wet etching the layer with a solution comprising by volume at least about 25 percent sulfuric acid, at least about 1 percent hydrogen peroxide, and at least about 0.005 percent hydrofluoric acid.

* * * * *